(12) United States Patent
Feng et al.

(10) Patent No.: US 11,894,527 B2
(45) Date of Patent: Feb. 6, 2024

(54) BATTERY CELL SELF-DISCHARGE CURRENT DETECTION METHOD, APPARATUS, AND DEVICE, AND COMPUTER STORAGE MEDIUM

(71) Applicant: JIANGSU CONTEMPORARY AMPEREX TECHNOLOGY LIMITED, Changzhou (CN)

(72) Inventors: Ting Feng, Changzhou (CN); Shaofei Wang, Changzhou (CN); Yimin Wei, Changzhou (CN)

(73) Assignee: JIANGSU CONTEMPORARY AMPEREX TECHNOLOGY LIMITED, Changzhou (CN)

( * ) Notice: Subject to any disclaimer, the term of this patent is extended or adjusted under 35 U.S.C. 154(b) by 0 days.

(21) Appl. No.: 18/365,224

(22) Filed: Aug. 4, 2023

(65) Prior Publication Data
US 2023/0411711 A1    Dec. 21, 2023

Related U.S. Application Data

(63) Continuation of application No. PCT/CN2022/101843, filed on Jun. 28, 2022.

(30) Foreign Application Priority Data

Aug. 9, 2021    (CN) .......................... 202110905543.8

(51) Int. Cl.
*H01M 10/44*    (2006.01)
*G01R 19/00*    (2006.01)
*G01R 31/385*    (2019.01)

(52) U.S. Cl.
CPC ........ *H01M 10/44* (2013.01); *G01R 19/0092* (2013.01); *G01R 31/385* (2019.01)

(58) Field of Classification Search
CPC .. H01M 10/44; G01R 31/385; G01R 19/0092
(Continued)

(56) References Cited

U.S. PATENT DOCUMENTS

| | | | | |
|---|---|---|---|---|
| 2017/0153290 A1* | 6/2017 | Sazhin | ................ | G01R 31/396 |
| 2018/0164363 A1* | 6/2018 | Brorein | ................ | G01R 31/367 |

FOREIGN PATENT DOCUMENTS

| | | |
|---|---|---|
| CN | 204515101 U | 7/2015 |
| CN | 106054086 A | 10/2016 |

(Continued)

OTHER PUBLICATIONS

International Search Report received in the corresponding International Application PCT/CN2022/101843, dated Sep. 28, 2022.
(Continued)

*Primary Examiner* — Nathaniel R Pelton
(74) *Attorney, Agent, or Firm* — Kilpatrick Townsend & Stockton LLP

(57) ABSTRACT

Disclosed are a battery cell self-discharge current detection method, apparatus, and device, and a computer storage medium. The method includes: controlling a constant voltage source to start charging a battery cell at a first moment, and acquiring a first rate of change of a target current over time in a first preset duration after the first moment; controlling, in the case where the first rate of change is greater than a first threshold value, a constant current source and the constant voltage source to charge the battery cell; acquiring, in the case of reaching a second moment, a second rate of change of the target current over time in a second preset duration after the second moment, wherein the second moment is a moment when the time for charging the battery cell using the constant current source and the constant voltage source reaches a third preset duration; and determining.

10 Claims, 3 Drawing Sheets

(58) Field of Classification Search
USPC .......................................................... 320/134
See application file for complete search history.

(56) References Cited

FOREIGN PATENT DOCUMENTS

| | | |
|---|---|---|
| CN | 108226786 A | 6/2018 |
| CN | 110687467 A | 1/2020 |
| CN | 110988715 A | 4/2020 |
| CN | 113138341 A | 7/2021 |
| CN | 113341208 A | 9/2021 |
| CN | 113359043 A | 9/2021 |
| JP | 2014222603 A | 11/2014 |
| JP | 2018096960 A | 6/2018 |
| JP | 2019113469 A | 7/2019 |
| JP | 2021021686 A | 2/2021 |
| JP | 2021051906 A | 4/2021 |
| KR | 102111492 B1 | 5/2020 |

OTHER PUBLICATIONS

Written Opinion received in the corresponding International Application PCT/CN2022/101843, dated Sep. 28, 2022.
Notice of Allowance received in the corresponding Chinese Application 202110905543.8, dated Sep. 15, 2021.
Notice of Allowance received in the corresponding Japanese Application 2023-539050, dated Nov. 27, 2023.

* cited by examiner

BATTERY CELL SELF-DISCHARGE CURRENT DETECTION METHOD, APPARATUS, AND DEVICE, AND COMPUTER STORAGE MEDIUM

CROSS-REFERENCE TO RELATED APPLICATIONS

The present application is a continuation of International Application PCT/CN2022/101843, filed Jun. 28, 2022, which claims the priority to Chinese patent application No. 202110905543.8 filed on Aug. 09, 2021 and entitled "BATTERY CELL SELF-DISCHARGE CURRENT DETECTION METHOD, APPARATUS, AND DEVICE, AND COMPUTER STORAGE MEDIUM", the entire content of which are incorporated herein by reference.

TECHNICAL FIELD

The present application relates to the technical field of batteries, and in particular to a battery cell self-discharge current detection method, apparatus, and device, and a computer storage medium.

BACKGROUND ART

As is well known, battery cells usually have self-discharge characteristics, which can be embodied in the fact that, for example, when a battery cell is in an open circuit state, there will still be a loss of electricity. The self-discharge current of battery cells can indicate the quality of the battery cells to a certain extent, and the detection for the self-discharge current of battery cells can help to exclude battery cells with poor quality.

In the prior art, a battery cell is charged by using a constant voltage source, and when the current value of the charging is stable, the stable current value is determined as the self-discharge current. However, this self-discharge current detection approach has the defect of low efficiency.

SUMMARY OF THE INVENTION

Embodiments of the present application provide a battery cell self-discharge current detection method, apparatus, and device, and a computer storage medium to solve the problem of low efficiency of battery cell self-discharge current detection in the prior art.

In a first aspect, an embodiment of the present application provides a battery cell self-discharge current detection method, the method including:

controlling a constant voltage source to start charging a battery cell at a first moment, and acquiring a first rate of change of a target current over time in a first preset duration after the first moment, wherein the target current is a total charging current to the battery cell;

controlling, in the case where the first rate of change is greater than a first threshold value, a constant current source and the constant voltage source to charge the battery cell, wherein the first threshold value is greater than or equal to 0;

acquiring, in the case of reaching a second moment, a second rate of change of the target current over time in a second preset duration after the second moment, wherein the second moment is a moment when the time for charging the battery cell using the constant current source and the constant voltage source reaches a third preset duration; and determining, in the case where the absolute value of the second rate of change is less than or equal to a second threshold value, a self-discharge current of the battery cell according to the target current at the second moment or the target current in a fourth preset duration after the second moment, wherein the second threshold value is greater than or equal to 0.

In a second aspect, an embodiment of the present application provides a battery cell self-discharge current detection apparatus, the apparatus including:

a control and acquisition module for controlling a constant voltage source to start charging a battery cell at a first moment, and acquiring a first rate of change of a target current over time in a first preset duration after the first moment, wherein the target current is a total charging current to the battery cell;

a first control module for controlling, in the case where the first rate of change is greater than a first threshold value, a constant current source and the constant voltage source to charge the battery cell;

a first acquisition module for acquiring, in the case of reaching a second moment, a second rate of change of the target current over time in a second preset duration after the second moment, wherein the second moment is a moment when the time for charging the battery cell using the constant current source and the constant voltage source reaches a third preset duration; and a first determination module for determining, in the case where the absolute value of the second rate of change is less than or equal to a second threshold value, a self-discharge current of the battery cell according to the target current at the second moment or the target current in a fourth preset duration after the second moment, wherein the first threshold value and the second threshold value are both greater than or equal to 0.

In a third aspect, an embodiment of the present application provides an electronic device, the device including: a processor and a memory storing computer program instructions, wherein the processor, when executing the computer program instructions, implements the battery cell self-discharge current detection method as illustrated in the first aspect.

In a fourth aspect, an embodiment of the present application provides a computer storage medium, wherein the computer storage medium has computer program instructions stored thereon, and the computer program instructions, when executed by a processor, implement the battery cell self-discharge current detection method as illustrated in the first aspect.

The battery cell self-discharge current detection method provided by an embodiment of the present application controls a constant voltage source to start charging a battery cell at a first moment, and acquires a first rate of change of a target current over time in a first preset duration after the first moment; controls, in the case where the first rate of change is greater than a first threshold value, a constant current source and the constant voltage source to charge the battery cell; and acquires, in the case of charging the battery cell using the constant current source and the constant voltage source for a third preset duration and reaching a second moment, a second rate of change of the target current over time in a second preset duration after the second moment; and determines, in the case where the absolute value of the second rate of change is less than or equal to a second threshold value, a self-discharge current of the battery cell according to the target current at the second moment or the target current in a fourth preset duration after the second moment. By adding a constant current source to the charging of the battery cell, the embodiments of the present application can effectively improve the detection efficiency for the self-discharge current of the battery cell. At the same time, adding a constant current source to the charging of the battery cell in the case where the first rate of change is greater than the first threshold value can overcome the influence of the polarization of the battery cell and other factors on the detection process and improve the detection accuracy for the self-discharge current of the battery cell.

DESCRIPTION OF DRAWINGS

In order to illustrate the technical solutions of the embodiments of the present application more clearly, the following briefly introduces the drawings required in the embodiments of the present application. Obviously, the drawings described below are only some embodiments of the present application. For those of ordinary skill in the art, other drawings can also be obtained according to the drawings without any creative effort.

DETAILED DESCRIPTION

Embodiments of the present application will be described in further detail hereinafter in conjunction with the accompanying drawings and embodiments. The following detailed description of the embodiments and the drawings are used to illustrate the principles of the present application by way of example, but should not be used to limit the scope of the present application, that is, the present application is not limited to the described embodiments.

It is noted that in the present application, relationship terms such as first and second are used only to distinguish one entity or operation from another, and do not necessarily require or imply any such actual relationship or order between those entities or operations. Further, the terms "includes," "comprises," or any other variation thereof are intended to cover non-exclusive inclusion, such that a process, method, article, or device that includes a series of elements includes not only those elements, but also other elements not expressly listed, or that also includes elements that are inherent to such a process, method, article, or device. Without further limitation, the elements defined by the phrase "including . . . " do not preclude the existence of additional identical elements in the process, method, article, or device in which the elements are included.

In order to solve the problems of the prior art, embodiments of the present application provide a battery cell self-discharge current detection method, apparatus, and device, and a computer storage medium. A framework in which the battery cell self-discharge current detection method as provided by an embodiment of the present application can be implemented will first be described below.

Figure 1:
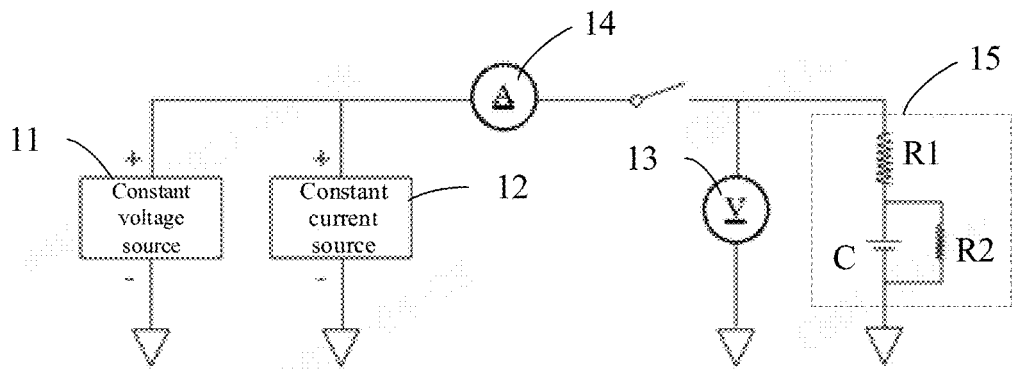
FIG. 1 is a schematic diagram of the structure of a framework in which a battery cell self-discharge current detection method as provided by an embodiment of the present application can be applied.

As shown in FIG. 1, this framework may include a constant voltage source 11, a constant current source 12, a voltage measurement circuit 13, a current measurement circuit 14, and a processor (not shown in the drawing).

Among them, the processor may be separately electrically connected to the components such as the constant voltage source 11, the constant current source 12, the voltage measurement circuit 13, and the current measurement circuit 14, so as to control these components. For example, the processor may acquire data collected by the voltage measurement circuit 13 and the current measurement circuit 14, or, may control an output current of the constant current source 12, and so on.

As shown above, the constant current source 12 may output a current, and can then charge the battery cell 15. The output current of this constant current source 12 may be adjustable, and the specific adjustment process may be controlled by the processor.

Similarly, the constant voltage source 11 may be a direct current (DC) power source as shown in FIG. 1. The constant voltage source 11 outputs a DC voltage to charge the battery cell 15. In some feasible embodiments, the output voltage of this constant voltage source 11 may also be adjustable, so as to charge different types of battery cells 15. Of course, the adjustment of the output voltage of the constant voltage source 11 may also be controlled by the processor.

The voltage measurement circuit 13 may be used to measure the voltage across the two ends of the battery cell 15. For example, the voltage measurement circuit 13 may measure the open circuit voltage of the battery cell 15.

The current measurement circuit 14 may be used to measure the total charging current of the battery cell 15. For example, the constant voltage source 11 and the constant current source 12 may be used as a whole as a charging power source for the battery cell 15, and the current measurement circuit 13 may be connected to this charging power source and the battery cell 15 separately through wires. Of course, in practical applications, it is also possible that the constant voltage source 11 alone is used to charge the battery cell 15, or the constant current source 12 alone is used to charge the battery cell 15, and in these cases, the current measurement circuit 14 may also measure the total charging current of the battery cell 15 accordingly.

In conjunction with FIG. 1, the battery cell 15 may equivalently include an effective capacitor C, a resistor R1 connected in series with the effective capacitor C, and a resistor R2 connected in parallel with the effective capacitor C. Based on this equivalent structure, it can be seen that even when the battery cell 15 is in an open circuit state, it can be discharged based on the circuit formed by the effective capacitor C and the resistor R2 and generate a self-discharge current.

In an example, as shown in FIG. 1, the specific connection relationships of the various elements in the above framework may be as follows: the positive electrode of the constant voltage source 11, the positive electrode of the constant current source 12, and one end of the current measurement circuit 14 are connected to each other, the other end of the current measurement circuit 14, one end of the voltage measurement circuit 13, and one end of the resistor R1 are connected to each other, the other end of the resistor R1, the positive electrode of the effective capacitor C, and one end of the resistor R2 are connected to each other, and the negative electrode of the constant voltage source 11, the negative electrode of the constant current source 12, the other end of the voltage measurement circuit 13, the negative electrode of the effective capacitor C, and the other end of the resistor R2 are connected to each other.

Of course, the above is only an exemplary description of the connection relationship of the components in this framework. The connection structure of the resistor R1, the resistor R2, and the effective capacitor C may be an equivalent structure of the battery cell 15, and the battery cell 15 may be connected as a whole to other components in a practical application. In general, the connection relationship of the components in the framework, or the specific composition of the components, can both be adjusted as needed, provided that the battery cell self-discharge current detection method can be realized.

Figure 2:
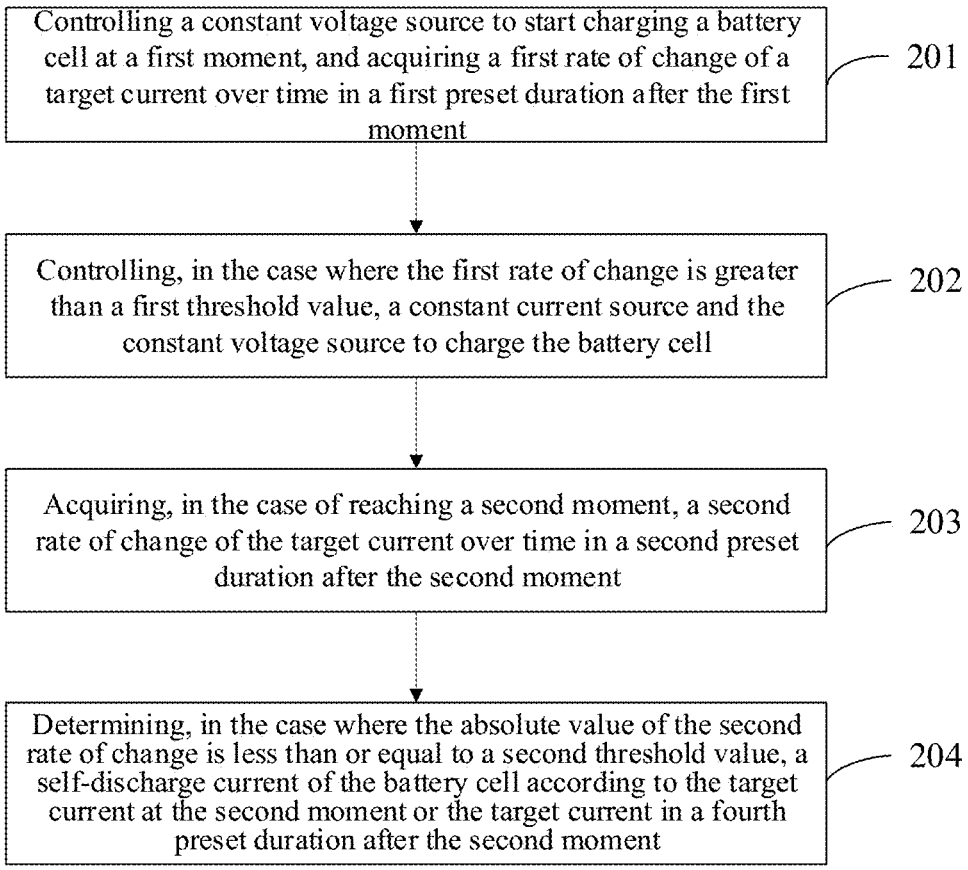
FIG. 2 is a schematic flow chart of a battery cell self-discharge current detection method as provided by an embodiment of the present application.

FIG. 2 illustrates a schematic flow chart of a battery cell self-discharge current detection method as provided by an embodiment of the present application. As shown in FIG. 2, the method includes:

step 201, controlling a constant voltage source to start charging a battery cell at a first moment, and acquiring a first rate of change of a target current over time in a first preset duration after the first moment, wherein the target current is a total charging current to the battery cell;

step 202, controlling, in the case where the first rate of change is greater than a first threshold value, a constant current source and the constant voltage source to charge the battery cell, wherein the first threshold value is greater than or equal to 0;

step 203, acquiring, in the case of reaching a second moment, a second rate of change of the target current over time in a second preset duration after the second moment, wherein the second moment is a moment when the time for charging the battery cell using the constant current source and the constant voltage source reaches a third preset duration; and step 204, determining, in the case where the absolute value of the second rate of change is less than or equal to a second threshold value, a self-discharge current of the battery cell according to the target current at the second moment or the target current in a fourth preset duration after the second moment, wherein the second threshold value is greater than or equal to 0.

In this embodiment, the constant voltage source may be used to charge the battery cell. The output voltage of the constant voltage source may be a preset value. For example, the output voltage of the constant voltage source may be determined based on the type of the battery cell. For example, when the battery cell to be detected for the self-discharge current is a cell with a rated output voltage of 1.5V, the output voltage of the constant voltage source may be set to 1.5V. For another example, the battery cell of which the self-discharge current is to be detected may be subjected to measurement of the open circuit voltage, and the measured open circuit voltage may be set as the input voltage of the constant voltage source, and the like.

The first moment may be considered to be the moment when charging of the battery cell using the constant voltage source is started. For example, in conjunction with the framework shown in FIG. 1, in step 201, the processor may control, in the case where a preset instruction is received, the constant voltage source to start charging the battery cell, and record the moment of starting charging, i.e., the first moment as described above.

By recording the first moment as t=0s, during the charging of the battery cell using the constant voltage source, it is possible to acquire the first rate of change of the target current over time from t=0 to 5 s. The 5 s here may correspond to the first preset duration mentioned above.

Of course, in practical applications, this first preset duration may be set as needed.

In some application scenarios, the rate of change of the target current over time may be acquired through differential calculations. For example, the target current may be denoted as I, and the rate of change of the target current over time may be denoted as k, then k may be calculated as k=dI/dt. That is, the first preset duration may be a shorter duration, for example, the first preset duration may be equal to the collection period of the target current by the current measurement circuit, and so on.

For a more intuitive understanding of the implementation of the embodiments of the present application, the preset durations may be considered to be selected in seconds in the examples of the embodiments below.

The first rate of change may be considered as the rate of change of the target current over time for the first preset duration after the first moment, and the first rate of change may be noted as $k_s$.

As shown above, the target current may be the total charging current for the battery cell, and the battery cell may be charged by the constant voltage source during the first preset duration after the first moment, and the corresponding generated target current may be considered as a result of the potential difference between the constant voltage source and the battery cell.

Specifically, due to the existence of self-discharge phenomenon, its output voltage, or open circuit voltage, may be continuously reduced. The output voltage of the constant voltage source is usually constant, so the potential difference between the constant voltage source and the battery cell will change.

In combination with FIG. 1, due to the existence of the resistor R1, when there is a potential difference between the constant voltage source and the battery cell, the current measurement circuit may collect a corresponding current value, which may correspond to the target current. The change of the potential difference between the constant voltage source and the battery cell may be reflected in the change of the target current over time.

In step 202, in the case where the first rate of change $k_s$ is greater than the first threshold value, the constant current source and the constant voltage source may be controlled to charge the battery cell simultaneously, wherein the first threshold value is greater than or equal to 0.

By way of example, the first threshold value may be equal to 0. At the beginning of detection of the self-discharge current, the output voltage of the battery cell theoretically is continuously decreasing due to the existence of the self-discharge phenomenon, so that the potential difference between the output voltage of the constant voltage source and the output voltage of the battery cell is also continuously increasing, and the target current increases accordingly. Therefore, the value of k is theoretically greater than 0 in the first preset duration after the first moment. When the first rate of change $k_s$ is greater than 0, it may be indicated that the self-discharge situation of the battery cell is more in line with the theoretical working state.

In combination with some application scenarios, at the beginning of detection of the self-discharge current, the battery cell may possibly be polarized because it has not been sufficiently rested, which in turn leads to the above-mentioned situation where the first rate of change $k_s$ is less than or equal to 0.

In this embodiment, the subsequent detection process is carried out when the first rate of change $k_s$ is greater than 0, which can reduce the influence of interference factors such as polarization phenomenon on the measurement results.

Of course, in practical applications, considering the influence of the measurement accuracy of the current measurement circuit, or the interference factors caused by the detection environment, the first threshold value may also be set to a value greater than 0.

In order to improve the detection efficiency for the self-discharge current of the battery cell, in step 202, the battery cell may be additionally charged using a constant current source on the basis of charging the battery cell using constant voltage source.

The output current of the constant current source may be a preset value. For example, this output current may be less than the self-discharge current of the battery cell that is determined empirically. Alternatively, this constant current source may be set to output a current of 0 to 100 μA depending on the type of the battery cell.

In combination with the framework shown in FIG. 1, the addition of the constant current source to the charging process of the battery cell may also be controlled by the processor. For example, in combination with the example given above, at the moment t=5 s, when the processor determines that $k_s$ is greater than 0, it may control the constant current source to charge the battery cell with the preset output current while, at the same time, maintaining the charging state of the constant voltage source to the battery cell.

It is easy to understand that the processor may also time the process of charging the battery cell using the constant current source and the constant voltage source.

In step 203, in the case where the time for charging the battery cell using the constant current source and the constant voltage source reaches the third preset duration, that is, reaching the second moment mentioned above, the second rate of change of the target current over time for the second preset duration after the second moment can be further acquired.

For example, after the constant current source is added at the moment of t=5 s, the time for charging using the constant voltage source and the constant current source may be timed, and in the case where charging has been performed for 120 s and the moment of t=125 s is reached, the second rate of change of the target current over time for the period of t=125 to 130 s can be acquired.

In the previous example, 120 s may correspond to the third preset duration mentioned above, and the moment of t=125 s may correspond to the second moment, while the second preset duration is 5 s, which corresponds to this duration from t=125 to 130 s. Of course, in practical applications, parameters such as the second preset duration or the third preset duration may both be set as needed.

To simplify the description, the second rate of change may be denoted as $k_0$. In step 204, in the case where the absolute value of the second rate of change $k_0$ is less than or equal to the second threshold value, the self-discharge current of the battery cell can be detected.

The second threshold value may be greater than or equal to 0. In an example, the second threshold value may be equal to 0.

As shown above, at the beginning of detection of the self-discharge current of the battery cell, k may be greater than 0 due to the existence of the self-discharge phenomenon of the battery cell. Theoretically, as the charging of the battery cell proceeds, since the charging current caused by the potential difference between the constant voltage source and the battery cell is continuously increasing, the total charging current (i.e., the target current) of the battery cell is caused to increase continuously. When the target current is equal to the self-discharge current of the battery cell, the potential difference between the constant voltage source and the battery cell no longer changes, and the target current also stabilizes, that is, the rate of change of the target current over time is 0.

Therefore, when the above-mentioned second rate of change $k_0$ is equal to the second threshold value 0, the target current may be considered to be equal to the self-discharge current of the battery cell, and the target current may be obtained through measurement by the above current measurement circuit.

For example, when the second rate of change $k_0$ is equal to the second threshold value the processor may acquire the target current collected by the current measurement circuit at the above second moment t=125 s, and determine the target current at the second moment as the self-discharge current.

In practical applications, considering the influence of factors such as measurement error, environmental interference or the quality of the battery cell, there may be certain fluctuations when the target current is stable. Reflected in the k value, the k value may not be constantly equal to 0.

Therefore, the above second threshold value may take a value slightly greater than 0, such as 3 mA/s. When the absolute value of the second rate of change is less than or equal to this second threshold value, the target current may be considered stable, and thus the target current at the second moment may be taken as the self-discharge current of the battery cell.

Of course, as shown above, there are still fluctuations when the target current is stable, and in order to improve the accuracy of detecting the self-discharge current of the battery cell, when the absolute value of the second rate of change is less than or equal to the second threshold value, the self-discharge current of the battery cell may also be determined according to the target current within the fourth preset duration after the second moment.

For example, the fourth preset duration may be 3 s, and the average value of the target current in the time range of t=125 to 128 s may be taken as the self-discharge current of the battery cell.

In practical applications, the above fourth preset duration may be set according to practical needs. In some feasible implementations, the median, etc., of the target current within the fourth preset duration after the second moment may also be used as the self-discharge current of the battery cell.

In addition, the starting point in time for determining the target current for the self-discharge current may be a certain moment after the second moment. For example, when the second moment is t=125 s and the fourth preset duration is 3 s, the average value of the target current in the time range of t=127 to 130 s may be taken as the self-discharge current of the battery cell.

In combination with the framework shown in FIG. 1, the target current measured by the current measurement circuit in step 203 may include the output current of the constant current source and the current caused by the potential difference between the constant voltage source and the battery cell. As shown above, the self-discharge current may be obtained when the target current is stable.

The self-discharge current depends on the characteristics of the battery cell, and its specific value may be considered as constant. The purpose of using the constant voltage source and the constant current source to charge the battery cell is to make the target current equal to this self-discharge current. With the addition of the constant current source, the requirement for the magnitude of the potential difference between the constant voltage source and the battery cell is reduced.

For example, for a battery cell of which the output voltage before detection (or the initial open circuit voltage) is 3V, when only a 3V constant voltage source is used for charging, the self-discharge current can only be measured in the case where the battery cell is self-discharged to an output voltage of 2.98V. When a constant current source is added, the self-discharge current can be measured in the case where the battery cell is self-discharged to an output voltage of 2.99V.

Since the self-discharge current of the battery cell can be considered as fixed, the time taken for the output voltage of the battery cell to drop from 3V to 2.99V is obviously less than the time taken for the output voltage of the battery cell to drop from 3V to 2.98V. Therefore, with the addition of the constant current source, the time required to detect the self-discharge current of the battery cell can be effectively reduced.

Of course, the above is only an example to facilitate understanding of the improvement of the detection efficiency for the self-discharge current by adding a constant current source. In practical applications, each data may be determined according to the actual situation.

The battery cell self-discharge current detection method provided by an embodiment of the present application controls a constant voltage source to start charging a battery cell at a first moment, and acquires a first rate of change of a target current over time in a first preset duration after the first moment; controls, in the case where the first rate of change is greater than a first threshold value, a constant current source and the constant voltage source to charge the battery cell; and acquires, in the case of charging the battery cell using the constant current source and the constant voltage source for a third preset duration and reaching a second moment, a second rate of change of the target current over time in a second preset duration after the second moment; and determines, in the case where the absolute value of the second rate of change is less than or equal to a second threshold value, a self-discharge current of the battery cell according to the target current at the second moment or the target current in a fourth preset duration after the second moment. By adding a constant current source to the charging of the battery cell, the embodiments of the present application can effectively improve the detection efficiency for the self-discharge current of the battery cell. At the same time, adding a constant current source to the charging of the battery cell in the case where the first rate of change is greater than the first threshold value can overcome the influence of the polarization of the battery cell and other factors on the detection process and improve the detection accuracy for the self-discharge current of the battery cell.

In an example, the above first threshold value may be determined according to the above first rate of change, for example, in the case where the acquired first rate of change is greater than the second threshold value, the first threshold value may be set to 3% of the first rate of change. In this way, the first threshold value may be correlated with the discharge characteristics of the battery cell itself, thus making the setting of the first threshold value more reasonable.

Of course, here it is only an example of the relationship between the first threshold value and the first rate of change, and the above 3% proportional relationship may also be adjusted as needed.

Optionally, before acquiring a first rate of change of a target current over time in a first preset duration after the first moment, the method further includes:

acquiring a target voltage value of the battery cell in an open circuit state; and controlling a constant voltage source to start charging a battery cell at a first moment includes:

controlling the constant voltage source to start charging the battery cell with the target voltage value as an output voltage at the first moment.

In this embodiment, the voltage value of the battery cell in the open circuit state, i.e., the target voltage value described above, may be measured before charging the battery cell using the constant voltage source.

It is easily understood that the open circuit state as described above may be the state of the battery cell without external load. In general, the voltage value of the battery cell in the open circuit state is equal to its rated output voltage; however, due to the existence of the self-discharge current, the power in the battery cell will be consumed and the voltage value in the open circuit state will be reduced.

In this embodiment, the voltage value of the open circuit state of the battery cell, i.e., the target voltage value described above, can be acquired. For example, in combination with an example, this target voltage value may be collected by the voltage measurement circuit described above and transmitted to the processor, and the processor in turn controls the input voltage to the constant voltage source according to this target voltage value.

The input voltage to the constant voltage source is equal to the target voltage value of the battery cell, so that in the process of charging the battery cell using the constant voltage source, to a certain extent, the detection efficiency for the self-discharge current of the battery cell can be improved without introducing any charging and discharging processes other than the self-discharge of the battery cell.

Optionally, the battery cell self-discharge current detection method may further include:

controlling, in the case where the first rate of change is less than or equal to the first threshold value, the constant voltage source to keep charging the battery cell until the first rate of change is greater than the first threshold value, and then returning to perform the step of controlling the constant current source and the constant voltage source to charge the battery cell.

As shown in the above example, when the first threshold value is equal to 0 and the first rate of change $k_s$ is greater than the first threshold value, it is indicated that the self-discharge situation of the battery cell is more in line with the theoretical working state. That is, when the first rate of change $k_s$ is greater than the threshold value, it may be considered that the battery cell has been adequately rested and the state is relatively stable.

On the contrary, when the first rate of change $k_s$ is less than or equal to the first threshold value, it may be considered that the state of the battery cell is not stable enough. For example, this state may be caused by the existence of the polarization phenomenon because the battery cell has not been sufficiently rested.

Therefore, in this embodiment, when the first rate of change is less than or equal to the first threshold value, the constant voltage source is controlled to keep charging the battery cell until the first rate of change is greater than the first threshold value, and then the constant current source is added to further detect the self-discharge current of the battery cell, thus improving the accuracy of the result of detection of the self-discharge current.

In an example, the first rate of change may be kept to be acquired in real time when the first rate of change is less than or equal to the first threshold value, so that the moment when the first rate of change is greater than the first threshold value can be determined in time, and then the constant current source can be added in time to the charging of the battery cell, thus improving the efficiency of monitoring the self-discharge current of the battery cell.

In another example, when the first rate of change is less than or equal to the first threshold value, the first rate of change may also be acquired after a preset duration of charging the battery cell using the constant voltage source.

Optionally, the battery cell self-discharge current detection method may further include:

adjusting an output current of the constant current source in the case where the absolute value of the second rate of change is greater than the second threshold value;

acquiring, in the case of reaching a third moment, a third rate of change of the target current over time in a fifth preset duration after the third moment, wherein the third moment is a moment when the timing that starts from a moment when the output current of the constant current source is adjusted reaches a sixth preset duration;

determining, in the case where the absolute value of the third rate of change is less than or equal to the second threshold value, the self-discharge current of the battery cell according to the target current at the third moment or the target current in a seventh preset duration after the third moment; and returning, in the case where the absolute value of the third rate of change is greater than the second threshold value, to perform the step of adjusting the output current of the constant current source.

As shown above, the output current of the constant current source in step 202 may be a preset value $i_0$. In practical applications, it is possible that the target current and the self-discharge current of the battery cell are still not in balance when the second moment is reached due to the influence of factors such as the preset value $i_0$ being much less than the self-discharge current of the battery cell. At this time, the absolute value of the second rate of change $k_0$ described above will usually be greater than the second threshold value.

In this embodiment, the output current of the constant current source may be adjusted in the case where the absolute value of the second rate of change $k_0$ is greater than the second threshold value.

For example, a preset fixed current value $\Delta i$ may be added on the basis of the preset value $i_0$ to obtain the adjusted output current ($i_0 + \Delta i$) of the constant current source.

Of course, in practical applications, $\Delta i$ may also not be a fixed value. For example, the magnitude of $\Delta i$ may be influenced by the second rate of change $k_0$.

In addition, in practical applications, there may also be multiple adjustments of the output current of the constant current source, and the amount of each adjustment of the output current may be fixed or may be different. As for the application scenario of conducting multiple adjustments of the output current of the constant current source, it will be explained in detail in the following.

Continuing with the above example, if the absolute value of the second rate of change acquired in t=125 to 130 s is greater than the second threshold value, the output current of the constant current source may be adjusted at the moment of t=130 s, and the adjusted output current is denoted as $i_1$.

In addition, the time for charging may be timed while the output current of the constant current source is being adjusted.

When the constant voltage source and the constant current source of which the output current is $i_1$ have been used to charge the battery cell for 90 s and the moment of t=220 s has been reached, the third rate of change of the target current over time for t=220 to 225 s can be acquired.

In the above example, the time for charging of 90 s may correspond to the sixth preset duration, the moment of t=220 s may correspond to the third moment, and the duration of 5 s included in t=220 to 225 s may correspond to the fifth preset duration.

Of course, the settings of the various durations here is an example for the purpose of understanding the specific implementation process of the battery cell self-discharge current detection method, and in practical applications, the various durations may be set as needed.

After charging the battery cell for the sixth preset duration using the constant voltage source and the constant current source of which the output current is $i_1$, the corresponding third rate of change obtained is denoted as $k_1$. When the absolute value of $k_1$ is less than or equal to the second threshold value, the self-discharge current of the battery cell may be determined according to the target current at the third moment or the target current for the seventh preset duration after the third moment.

Here, the self-discharge current is determined in a manner that is actually similar to that for the determination of the self-discharge current when the absolute value of $k_0$ is less than or equal to the second threshold value as described above, and will not be repeated here for simplicity of explanation.

In this embodiment, when the absolute value of $k_1$ is greater than the second threshold value, then the process may return to perform the step of adjusting the output current of the constant current source. It is easy to understand that in this case, in the process of detecting the self-discharge current of the battery cell, there may exist a process of multiple adjustment of the output current of the constant current source.

In this way, the process of adjusting the output current of the constant current source from $i_0$ to $i_1$ may be defined as the first adjustment of the output current of the constant current source, while the process of adjusting the output current of the constant current source from $i_1$ to $i_2$ may be defined as the second adjustment of the output current of the constant current source, and so on.

After each adjustment of the output current of the constant current source, there may exist executive steps of charging the battery cell for the sixth preset duration and acquiring the third rate of change, and so on, which will not be repeated here.

By constantly adjusting the output current of the constant current source, this embodiment helps to make the target current and the self-discharge current of the battery cell reach a balance as soon as possible, and then can effectively improve the detection efficiency for the self-discharge current of the battery cell.

For the sake of understanding, the steps of adjusting the output current of the constant current source for the nth time, charging the battery cell for the sixth preset duration accordingly, and acquiring the third rate of change, etc., may be defined to be performed in the nth adjustment cycle. Accordingly, the process of detecting the self-discharge current of the battery cell by adjusting the output current of the constant current source may be described as follows:

Step one: adjusting, in the nth adjustment cycle, the output current of the constant current source to obtain the adjusted output current $i_n$, where n is a positive integer.

Step two: charging the battery cell for the sixth preset duration using the constant voltage source and the constant current source of which the output current is $i_n$, until reaching the third moment.

Step three: acquiring the third rate of change $k_n$ of the target current over time for the fifth preset duration after the third moment.

Step four: judging whether the absolute value of the third rate of change $k_n$ is less than or equal to the second threshold value; if yes, determining the self-discharge current of the battery cell; and if not, returning to perform step one, or entering the (n+1)th adjustment cycle.

Optionally, adjusting the output current of the constant current source may include:

acquiring a first output current, wherein the first output current is an output current obtained after the (n−1)th adjustment of the output current of the constant current source; and adjusting the first output current to obtain a second output current, wherein the second output current is an output current obtained after the nth adjustment of the output current of the constant current source, n being a positive integer, and in the case where n is equal to 1, the first output current is a preset current.

In combination with the above description of the adjustment cycle, the output current obtained after the nth adjustment of the output current of the constant current source, i.e., the second output current mentioned above, may be denoted as $i_n$. Accordingly, the first output current may be denoted as $i_{n-1}$.

It is easily understood that n is a positive integer, and $i_{n-1}$ may be $i_0$ when n is equal to 1, i.e., the preset value of the output current of the constant current source as described above, which may be referred to herein as the preset current.

In this implementation, during the nth adjustment of the output current of the constant current source, the adjustment may be performed on the basis of the output current obtained after the (n−1)th adjustment of the output current of the constant current source. In this way, it helps to adjust the output current of the constant current source according to the real-time charging situation of the battery cell and improves the reliability of the adjustment of the output current of the constant current source.

For example, the preset current $i_0$ may be 10 μA, and the output current obtained after the first adjustment of the output current of the constant current source is $i_1$=15 μA, and in the process of the second adjustment of the output current of the constant current source, the output current of the constant current source may be adjusted on the basis of $i_1$=15 μA.

Of course, in some other feasible implementations, in the process of the second adjustment of the output current of the constant current source, the output current of the constant current source may be adjusted on the basis of $i_0$=10 μA.

Optionally, adjusting the first output current to obtain a second output current includes:

determining a target current adjustment amount according to a target rate of change, wherein the target rate of change is the third rate of change acquired after the (n−1)th adjustment of the output current of the constant current source, and in the case where n is equal to 1, the target rate of change is the second rate of change; and adjusting the first output current according to the target current adjustment amount to obtain the second output current.

In combination with the above description, in an ideal case, the rate of change k of the target current during the charging of the battery cell may gradually change from a positive value to 0. With the addition of the constant current source, this change process will be accelerated.

In some application scenarios, if a fixed upward adjustment step of the output current is maintained every time the output current of the constant current source is adjusted, then when the upward adjustment step is large, the output current of constant current source will easily be caused to be greater than the self-discharge current of battery cell, and then it is difficult to effectively detect the self-discharge current of battery cell.

Therefore, in this embodiment, the target rate of change can be acquired, and the target current adjustment amount at the nth adjustment of the output current of the constant current source can be determined according to the target rate of change.

The target rate of change is the third rate of change acquired after the (n−1)th adjustment of the output current of the constant current source. In combination with the description of the adjustment cycle above, the target rate of change may correspond to $k_{n-1}$ in the nth adjustment cycle.

It is easy to understand that n is a positive integer and when n is equal to 1, $k_{n-1}$ may be $k_0$, i.e., the second rate of change described above.

For example, in the nth adjustment of the output current of the constant current source, if $k_{n-1}$ is a positive value and greater than the first threshold value, the target current adjustment amount may be determined as 5 μA; and if $k_{n-1}$ is a negative value and its absolute value is greater than the first threshold value, then the target current adjustment amount may be determined as −2 μA.

That is, in practical applications, a preset adjustment step may be determined as the target current adjustment amount in the nth adjustment cycle, and this preset adjustment step may be determined separately according to whether the target rate of change is positive or negative.

In the case where the target current adjustment amount is determined, the first output current may be further adjusted based on the target current adjustment amount to obtain the second output current.

In this embodiment, the adjustment amount to the first output current is determined based on the target rate of change, which can improve the reasonableness of the obtained second output current and help to achieve the state of balance between the target current and the self-discharge current of the battery cell in a more efficient manner, thus realizing the reliable detection of the self-discharge current of the battery cell.

In order to improve the smoothness of changes of the output current of the constant current source and more reliably obtain a state in which the target current and the self-discharge current of the battery cell are in balance, in one implementation, the target current adjustment amount is determined according to the target rate of change, including:

determining a product of the target rate of change and a preset ratio as the target current adjustment amount, wherein the preset ratio is a positive number.

In contrast to the way in which a fixed adjustment step is determined as the target current adjustment amount in the nth adjustment cycle, in this implementation, the product of $k_{n-1}$ and the preset ratio may be determined as the target current adjustment amount in the nth adjustment cycle.

Here, the preset ratio may be an empirical value. In an example, the preset ratio may be determined as $10/k_s$ when the first rate of change $k_s$ as described above is greater than the first threshold value, so that the preset ratio is associated with the discharge characteristics of the battery cell itself, thus improving the reasonableness of the preset ratio.

Of course, in another example, the preset ratio may be predetermined according to the type of the battery cell without considering the first rate of change $k_s$ as described above.

The battery cell self-discharge current detection method provided by an embodiment of the present application will be described below in conjunction with a specific application example.

Figure 3:
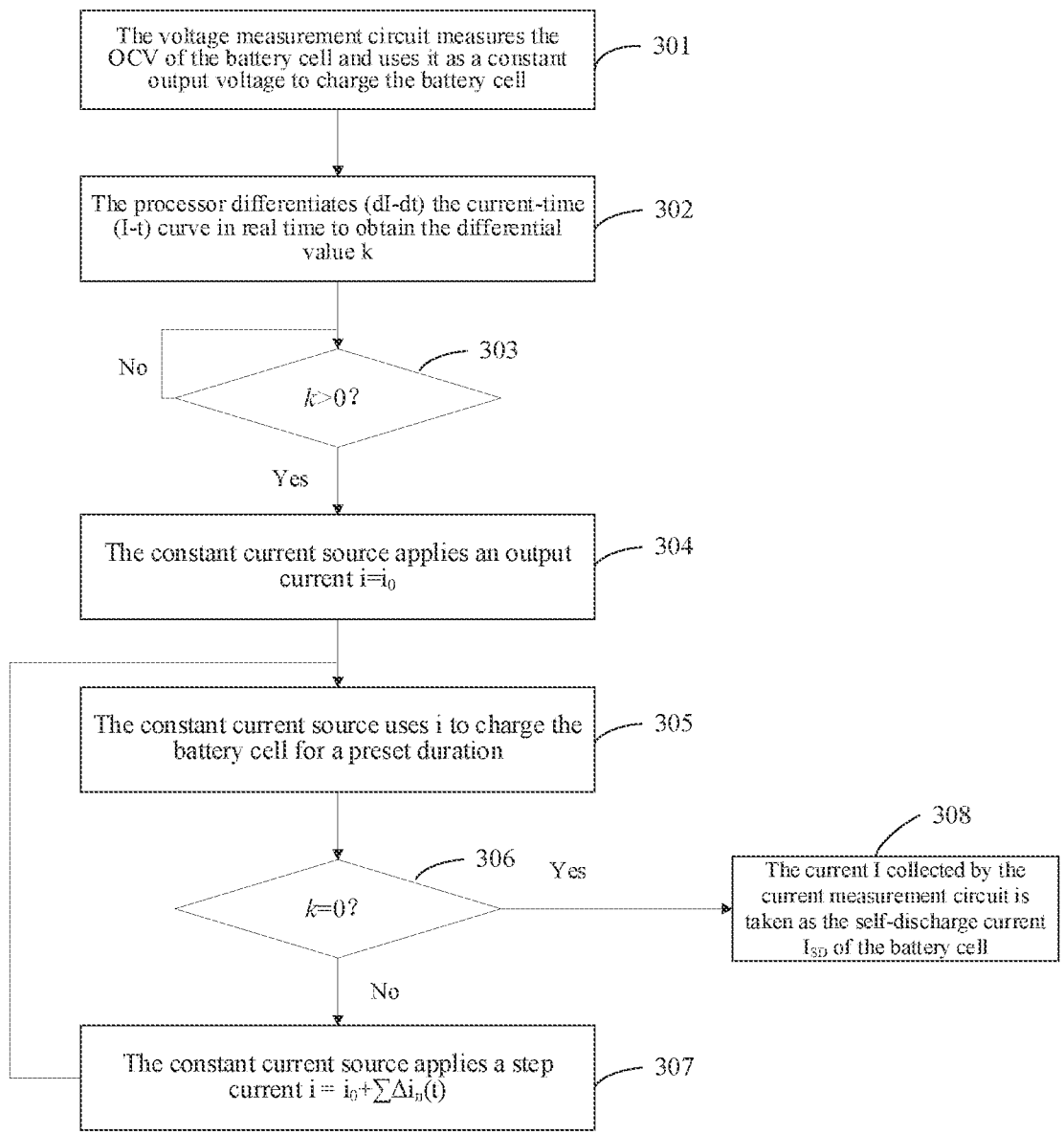
FIG. 3 is a schematic flow chart of a battery cell self-discharge current detection method in a specific application example.

In this specific application example, the battery cell self-discharge current detection method may be implemented based on the framework as shown in FIG. 1. As shown in FIG. 3, the battery cell self-discharge current detection method includes the following steps:

In step 301, the voltage measurement circuit measures the open circuit voltage (OCV) of the battery cell and uses it as a constant output voltage to charge the battery cell;

in this step, the OCV (which is set equal to $U_0$) measured by the voltage measurement circuit may be sent to the processor, and the processor controls, according to the OCV, the constant voltage source to output $U_0$ to charge the battery cell.

In step 302, the processor differentiates (dI/dt) the current-time (I-t) curve in real time to obtain the differential value k;

in this step, the current I may be collected by the current measurement circuit, and this current I may be considered as the total charging current (i.e., the target current) to the battery cell. The differential value k may indicate the rate of change of the total charging current to the battery cell over time. In this step, the differential value k may be considered to be equal to the first rate of change $k_s$ as described above.

In step 303, the processor makes a real-time judgement of the differential value k, and if k>0, step 304 is executed, and if k≤0, the charging of the battery cell by the constant voltage source is maintained and the judgment of the differential value k is continued;

it is easily understood that the parameter 0 of this step may correspond to the first threshold value in the above embodiments.

In step 304, the constant current source applies an output current $i=i_0$;

here, $i_0$ may be an empirical value, which may be determined according to the actual situation of the battery cell (e.g., the type of the battery cell or the k value obtained in step 302, etc.).

In some application scenarios, the value range of $i_0$ may be from 0 to 100 μA.

In step 305, the constant current source uses i to charge the battery cell for a preset duration.

In step 306, the processor makes a real-time judgement of the differential value k, and if k≠0 step 307 is executed, and if k=0, step 308 is executed;

it is easily understood that the parameter 0 of this step may correspond to the second threshold value in the above embodiments.

In step 307, the constant current source applies a step current $i=i_0+\Sigma \Delta i_n(t)$ and the process returns to perform step 305, where n may be the number of times the step current is applied (or the number of times i is adjusted) and $\Delta i_n(t)$ may be the value of the step current applied for the nth time (or the target current adjustment amount when i is adjusted for the nth time).

Exemplarily, $\Delta i_n(t)$ may be derived in the following manner: $\Delta i_n(t)=a*k_{n-1}$, where a may be a constant and $k_{n-1}$ is the differential value k obtained after applying the step current for the (n−1)th time and charging for the preset duration.

For example, by denoting k obtained in step 303 as $k_0$, then in the case where $k_0>0$, the value of a may be $1/k_0 \leq a \leq 2000/k_0$.

In step 308, the current I collected by the current measurement circuit is taken as the self-discharge current $I_{SD}$ of the battery cell.

As can be seen, the battery cell self-discharge current detection method provided by an embodiment of the present application uses a constant current source and a constant voltage source to charge the battery cell, so that the target current is equal to the self-discharge current, thereby measuring the self-discharge current of the battery cell. By adopting the current step method, the time for measuring the self-discharge current can be effectively shortened, thus achieving the effective detection of the self-discharge current.

Figure 4:
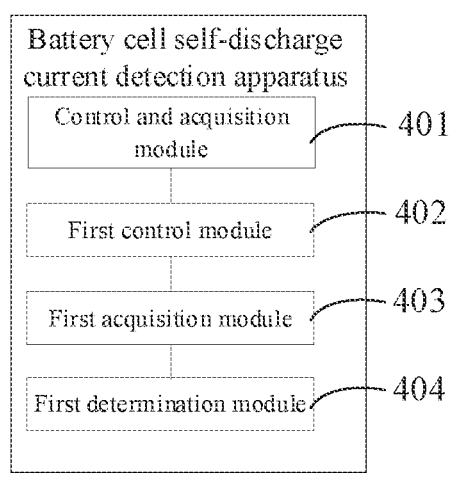
FIG. 4 is a schematic diagram of the structure of a battery cell self-discharge current detection apparatus as provided by an embodiment of the present application.

As shown in FIG. 4, the embodiments of the present application further provide a battery cell self-discharge current detection apparatus, which includes:

a control and acquisition module 401 for controlling a constant voltage source to start charging a battery cell at a first moment, and acquiring a first rate of change of a target current over time in a first preset duration after the first moment, wherein the target current is a total charging current to the battery cell;

a first control module 402 for controlling, in the case where the first rate of change is greater than a first threshold value, a constant current source and the constant voltage source to charge the battery cell;

a first acquisition module 403 for acquiring, in the case of reaching a second moment, a second rate of change of the target current over time in a second preset duration after the second moment, wherein the second moment is a moment when the time for charging the battery cell using the constant current source and the constant voltage source reaches a third preset duration; and a first determination module 404 for determining, in the case where the absolute value of the second rate of change is less than or equal to a second threshold value, a self-discharge current of the battery cell according to the target current at the second moment or the target current in a fourth preset duration after the second moment, wherein the first threshold value and the second threshold value are both greater than or equal to 0.

Optionally, the battery cell self-discharge current detection apparatus may further include:

a second acquisition module for acquiring a target voltage value of the battery cell in an open circuit state, wherein accordingly, the control and acquisition module 401 may be specifically used to control the constant voltage source to charge the battery cell with the target voltage value as the output voltage.

Optionally, the battery cell self-discharge current detection apparatus may further include:

a second control module for controlling, in the case where the first rate of change is less than or equal to the first threshold value, the constant voltage source to keep charging the battery cell until the first rate of change is greater than the first threshold value, and then returning to perform the step of controlling the constant current source and the constant voltage source to charge the battery cell.

Optionally, the battery cell self-discharge current detection apparatus may further include:

an adjustment module for adjusting an output current of the constant current source in the case where the absolute value of the second rate of change is greater than the second threshold value;

a third acquisition module for acquiring, in the case of reaching a third moment, a third rate of change of the target current over time in a fifth preset duration after the third moment, wherein the third moment is a moment when the timing that starts from a moment when the output current of the constant current source is adjusted reaches a sixth preset duration;

a second determination module for determining, in the case where the absolute value of the third rate of change is less than or equal to the second threshold value, the self-discharge current of the battery cell according to the target current at the third moment or the target current in a seventh preset duration after the third moment; and an execution module for returning, in the case where the absolute value of the third rate of change is greater than the second threshold value, to perform the step of adjusting the output current of the constant current source.

Optionally, the adjustment module may include:

an acquisition unit for acquiring a first output current, wherein the first output current is an output current obtained after the (n−1)th adjustment of the output current of the constant current source; and an adjustment unit for adjusting the first output current to obtain a second output current, wherein the second output current is an output current obtained after the nth adjustment of the output current of the constant current source, n being a positive integer, and in the case where n is equal to 1, the first output current is a preset current.

Optionally, the adjustment unit may include:

a determination sub-unit for determining a target current adjustment amount according to a target rate of change, wherein the target rate of change is the third rate of change acquired after the (n−1)th adjustment of the output current of the constant current source, and in the case where n is equal to 1, the target rate of change is the second rate of change; and an adjustment sub-unit for adjusting the first output current according to the target current adjustment amount to obtain the second output current.

Optionally, the determination sub-unit may be used specifically for: determining a product of the target rate of change and a preset ratio as the target current adjustment amount, wherein the preset ratio is a positive number.

It should be noted that this battery cell self-discharge current detection apparatus is an apparatus corresponding to the battery cell self-discharge current detection method described above, and all the implementations of the above method embodiments are applicable in the embodiments of this apparatus and can achieve the same technical effect.

Figure 5:
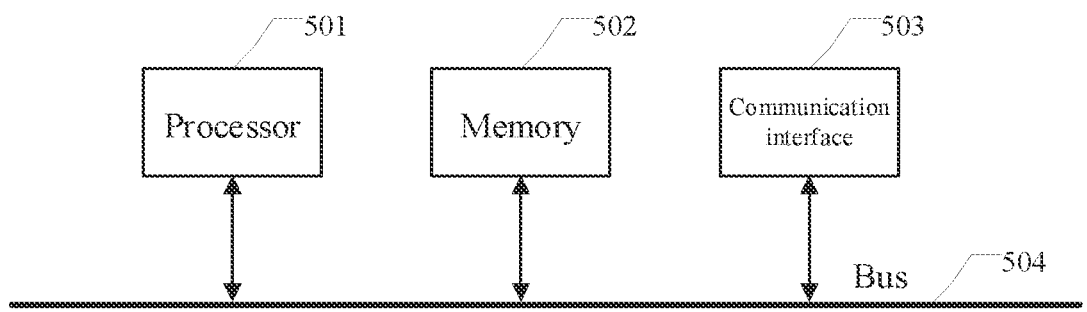
FIG. 5 is a schematic diagram of the structure of an electronic device as provided by an embodiment of the present application.

FIG. 5 illustrates a schematic diagram of the hardware structure of an electronic device as provided by an embodiment of the present application.

The electronic device may include a processor 501 and a memory 502 storing computer program instructions.

Exemplarily, the above processor 501 may include a central processing unit (CPU), or an application specific integrated circuit (ASIC), or may be configured to implement one or more integrated circuits of the embodiments of the present application.

The memory 502 may include a mass memory for data or instructions. For example and non-restrictively, the memory 502 may include a Hard Disk Drive (HDD), a floppy disk drive, a flash memory, an optical disk, a magneto-optical disk, a magnetic tape, or a Universal Serial Bus (USB) drive, or a combination of two or more of the above. The memory 502 may include a removable or non-removable (or fixed) medium, where appropriate. The memory 502 may be internal or external to an integrated gateway disaster recovery device, where appropriate. In a specific embodiment, the memory 502 is a non-volatile solid state memory.

The memory may include a read-only memory (ROM), a random-access memory (RAM), a disk storage medium device, an optical storage medium device, a flash memory device, or an electrical, optical or other physical/tangible memory device. Therefore, usually, the memory includes one or more tangible (non-transitory) computer-readable storage mediums (e.g., memory devices) encoded with software including computer-executable instructions, and the software, when executed (e.g., by one or more processors), is operable to perform the operations described with reference to the method according to the present disclosure.

The processor 501 implements any of the battery cell self-discharge current detection methods in the above embodiments by reading and executing the computer program instructions stored in the memory 502.

In an example, the electronic device may further include a communication interface 503 and a bus 504. Here, as shown in FIG. 5, the processor 501, the memory 502, and the communication interface 503 are connected and perform communication with each other via the bus 504.

The communication interface 503 is mainly configured to implement communication between the modules, apparatuses, units, and/or devices in the embodiments of the present application.

The bus 504 includes hardware, software, or both hardware and software, and couples the components of the online data flow metering device to each other. For example and non-restrictively, the bus may include an accelerated graphics port (AGP) or other graphics buses, an enhanced industry standard architecture (EISA) bus, a front side bus (FSB), HyperTransport (HT) interconnect, an industry standard architecture (ISA) bus, infiniband interconnect, a low pin count (LPC) bus, a memory bus, a microchannel architecture (MCA) bus, a peripheral component interconnect (PCI) bus, a PCI-Express (PCI-X) bus, a serial advanced technology attachment (SATA) bus, a Video Electronics Standards Association local (VLB) bus, or other appropriate buses, or a combination of two or more of the above. The bus 504 may include one or more buses, where appropriate. While embodiments in the present application describe and illustrate a particular bus, the present application contemplates any appropriate bus or interconnect.

In addition, in conjunction with the battery cell self-discharge current detection methods in the above embodiments, an embodiment of the present application may provide a computer storage medium to implement the methods. The computer storage medium has computer program instructions stored thereon; and the computer program instructions, when executed by a processor, implement any of the battery cell self-discharge current detection methods in the above embodiments.

To be specific, the present application is not limited to the specific configurations and processes described above and shown in the figures. For the sake of brevity, detailed descriptions of known methods are omitted here. In the above embodiments, several specific steps are described and shown as examples. However, the method process of the present application is not limited to the specific steps that are described and shown, and those skilled in the art may make various alterations, modifications, and additions, or change the order between the steps after comprehending the spirit of the present application.

The functional blocks shown in the above structural block diagrams may be implemented as hardware, software, firmware, or a combination thereof. When the functional blocks are implemented as hardware, it may be, for example, an electronic circuit, an Application Specific Integrated Circuit (ASIC), appropriate firmware, a plug-in, or a function card. When the functional blocks are implemented as software, elements of the present application are programs or code segments used to execute required tasks. The programs or code segments may be stored in a machine-readable medium or transmitted over a transmission medium or communication link by a data signal carried in a carrier wave. The "machine-readable medium" may include any medium that can store or transmit information. Examples of machine-readable mediums include an electronic circuit, a semiconductor memory device, an ROM, a flash memory, an erasable ROM (EROM), a floppy disk, a CD-ROM, an optical disk, a hard disk, an optic fiber medium, a radio frequency (RF) link, and the like. The code segments may be downloaded via a computer network such as the Internet or an intranet.

It should be further noted that the exemplary embodiments referred to in the present application describe some methods or systems based on a series of steps or apparatuses. However, the present application is not limited to the order of the above steps, i.e., the steps may be executed in the order mentioned in the embodiments or in an order different from the order in the embodiments, or several steps may be executed concurrently.

Various aspects of the present disclosure are described above with reference to the flow charts and/or block diagrams of the methods, apparatuses (systems) and computer program products according to embodiments of the present disclosure. It should be understood that each block in the flow charts and/or block diagrams and combinations of blocks in the flow charts and/or block diagrams may be implemented by computer program instructions. These computer program instructions may be provided to a general purpose computer, a specialized computer, or a processor of another programmable data processing apparatus to produce a machine such that the instructions executed by the processor of the computer or other programmable data processing apparatus enable the implementation of the functions/actions specified in one or more blocks of the flow charts and/or block diagrams. Such a processor may be, but is not limited to, a general purpose processor, a specialized processor, a special application processor, or a field programmable logic circuit. It can also be understood that each block in the block diagrams and/or flow charts and combinations of blocks in the block diagrams and/or flow charts may also be implemented by dedicated hardware that performs the specified functions or actions, or may be implemented by a combination of dedicated hardware and computer instructions.

Although the present application has been described with reference to the preferred embodiments, various improvements can be made thereto and components thereof can be replaced with equivalents without departing from the scope of the present application. In particular, the technical features mentioned in the various embodiments can be combined in any manner as long as there is no structural conflict. The present application is not limited to the specific embodiments disclosed herein, but rather includes all technical solutions falling within the scope of the claims.

What is claimed is:

1. A battery cell self-discharge current detection method, comprising:
controlling a constant voltage source to start charging a battery cell at a first moment, and acquiring a first rate of change of a target current over time in a first preset duration after the first moment, wherein the target current is a total charging current to the battery cell;
controlling, in the case where the first rate of change is greater than a first threshold value, a constant current source and the constant voltage source to charge the battery cell, wherein the first threshold value is greater than or equal to 0;
acquiring, in the case of reaching a second moment, a second rate of change of the target current over time in a second preset duration after the second moment, wherein the second moment is a moment when the time for charging the battery cell using the constant current source and the constant voltage source reaches a third preset duration; and
determining, in the case where the absolute value of the second rate of change is less than or equal to a second threshold value, a self-discharge current of the battery cell according to the target current at the second moment or the target current in a fourth preset duration after the second moment, wherein the second threshold value is greater than or equal to 0.

2. The method according to claim 1, wherein before acquiring the first rate of change of the target current over time in a first preset duration after the first moment, the method further comprises:
acquiring a target voltage value of the battery cell in an open circuit state; and
controlling the constant voltage source to start charging the battery cell at a first moment comprises:
controlling the constant voltage source to start charging the battery cell with the target voltage value as an output voltage at the first moment.

3. The method according to claim 1, further comprising:
controlling, in the case where the first rate of change is less than or equal to the first threshold value, the constant voltage source to keep charging the battery cell until the first rate of change is greater than the first threshold value, and then returning to perform the step of controlling the constant current source and the constant voltage source to charge the battery cell (15).

4. The method according to claim 1, the method further comprising:
adjusting an output current of the constant current source in the case where the absolute value of the second rate of change is greater than the second threshold value;
acquiring, in the case of reaching a third moment, a third rate of change of the target current over time in a fifth preset duration after the third moment, wherein the third moment is a moment when the timing that starts from a moment when the output current of the constant current source is adjusted reaches a sixth preset duration;
determining, in the case where the absolute value of the third rate of change is less than or equal to the second threshold value, the self-discharge current of the battery cell according to the target current at the third moment or the target current in a seventh preset duration after the third moment; and returning, in the case where the absolute value of the third rate of change is greater than the second threshold value, to perform the step of adjusting the output current of the constant current source.

5. The method according to claim 4, wherein adjusting the output current of the constant current source comprises:
   acquiring a first output current, wherein the first output current is an output current obtained after the (n−1)th adjustment of the output current of the constant current source (12); and
   adjusting the first output current to obtain a second output current, wherein the second output current is an output current obtained after the nth adjustment of the output current of the constant current source, n being a positive integer, and in the case where n is equal to 1, the first output current is a preset current.

6. The method according to claim 5, wherein the adjusting the first output current to obtain a second output current comprises:
   determining a target current adjustment amount according to a target rate of change, wherein the target rate of change is the third rate of change acquired after the (n−1)th adjustment of the output current of the constant current source, and in the case where n is equal to 1, the target rate of change is the second rate of change; and
   adjusting the first output current according to the target current adjustment amount to obtain the second output current.

7. The method according to claim 6, wherein determining the target current adjustment amount according to the target rate of change comprises:
   determining a product of the target rate of change and a preset ratio as the target current adjustment amount, wherein the preset ratio is a positive number.

8. An electronic device, comprising: a processor and a memory storing computer program instructions, wherein the processor, when executing the computer program instructions, implements the battery cell self-discharge current detection method of claim 1.

9. A computer storage medium, wherein the computer storage medium has computer program instructions stored thereon, and the computer program instructions, when executed by a processor, implement the battery cell self-discharge current detection method of claim 1.

10. A battery cell self-discharge current detection apparatus, comprising:
   a control and acquisition module for controlling a constant voltage source to start charging a battery cell at a first moment, and acquiring a first rate of change of a target current over time in a first preset duration after the first moment, wherein the target current is a total charging current to the battery cell;
   a first control module for controlling, in the case where the first rate of change is greater than a first threshold value, a constant current source and the constant voltage source to charge the battery cell;
   a first acquisition module for acquiring, in the case of reaching a second moment, a second rate of change of the target current over time in a second preset duration after the second moment, wherein the second moment is a moment when the time for charging the battery cell using the constant current source and the constant voltage source reaches a third preset duration; and
   a first determination module for determining, in the case where the absolute value of the second rate of change is less than or equal to a second threshold value, a self-discharge current of the battery cell according to the target current at the second moment or the target current in a fourth preset duration after the second moment, wherein the first threshold value and the second threshold value are both greater than or equal to 0.

* * * * *